United States Patent [19]
Sunami et al.

[11] Patent Number: 5,266,815
[45] Date of Patent: Nov. 30, 1993

[54] SEMICONDUCTOR INTEGRATED CIRCUIT DEVICE HAVING SUPERCONDUCTIVE LAYER AND ISOLATION MEMBER WITH NITRIDE ISOLATION

[75] Inventors: Hideo Sunami, Tokyo; Toshikazu Nishino, Kawasaki; Shoji Shukuri, Koganei; Yasuo Wada, Tokyo; Yutaka Misawa, Katsuta; Takahiko Kato, Hitachi, all of Japan

[73] Assignee: Hitachi, Ltd., Tokyo, Japan

[21] Appl. No.: 863,530

[22] Filed: Apr. 6, 1992

Related U.S. Application Data

[63] Continuation of Ser. No. 173,934, Mar. 28, 1988.

[30] Foreign Application Priority Data

| Mar. 27, 1987 | [JP] | Japan | 62-71462 |
| May 13, 1987 | [JP] | Japan | 62-114674 |
| Jun. 5, 1987 | [JP] | Japan | 62-139714 |

[51] Int. Cl.$^5$ ............. H01L 29/00; H01L 39/22
[52] U.S. Cl. ............. 257/30; 257/31; 257/32; 257/33; 505/874
[58] Field of Search ............. 505/847, 874; 257/30, 257/31, 32, 33

[56] References Cited

U.S. PATENT DOCUMENTS

| 4,464,065 | 8/1984 | Wolf et al. | 505/847 |
| 4,660,061 | 4/1987 | Sweeny et al. | 505/874 |
| 4,724,475 | 2/1988 | Matsuda | 357/79 |
| 4,837,609 | 6/1989 | Gurvitch et al. | 357/71 |

FOREIGN PATENT DOCUMENTS 57-46658  9/1977  Japan.

OTHER PUBLICATIONS

A. I. Braginski, "Material Constraints on Electronic Applications of Oxide Superconductors" (Proc. HTSC-M$^2$) Interlaken Apr. 14, 1988.

J. R. Gavaler et al., "Fabrication of High-T$_c$ Superconducting YBa$_2$Cu$_3$O$_7$ Films" (Proc. MRS Spring Mtg.) 1988, Apr. 14, 1988.

Koinuma et al. "Chemical Interaction Between Ba$_2$YCu$_3$O$_{7-\delta}$ and Substrate Materials in the Solid State" *Jap. J. Appl. Phys.* vol. 27 (7) Jul. 1988 pp. L1216-L1218.

*Primary Examiner*—Andrew J. James
*Assistant Examiner*—Valencia M. Martin
*Attorney, Agent, or Firm*—Antonelli, Terry, Stout & Kraus

[57] ABSTRACT

Technology for using a wiring of a superconductive material in semiconductor integrated circuit device. An isolation layer and/or a barrier layer are provided for preventing diffusion of harmful composition of the superconductive material for the semiconductor device. Control of a circuit can be made utilizing the characteristics of a superconductive material. Also, the characteristics of a superconductive material may be controlled. A method of forming a layer of superconductive material, well compatible with the widely used process of manufacturing integrated circuit devices, is also disclosed.

44 Claims, 18 Drawing Sheets

ABSOLUTE TEMPERATURE T (K)

ABSOLUTE TEMPERATURE T (K)

SEMICONDUCTOR INTEGRATED CIRCUIT DEVICE HAVING SUPERCONDUCTIVE LAYER AND ISOLATION MEMBER WITH NITRIDE ISOLATION

This application is a continuing application of application Ser. No. 07/173,934, filed on Mar. 28, 1988.

BACKGROUND OF THE INVENTION

This invention relates to wirings in semiconductor integrated circuits and more particularly to wirings of extremely low resistance using superconductive materials.

Further, this invention relates to a structure of wiring using an oxide superconductor material in the shape of a thin film, and more particularly to a structure of wiring adapted for multi-layer or multi-level wiring in a semiconductor device and for a multi-layer wiring substrate.

Further, this invention relates to an integrated circuit device provided with a thermo-detector or temperature sensor, and more particularly to an integrated circuit device integrating superconducting materials and adapted for detecting a change in temperature at a high sensitivity.

Further, this invention relates to a method of fabricating a superconductor thin film, and more particularly to a method of forming a pattern of a high-temperature superconductor thin film, adapted for forming a fine pattern.

In conventional devices using superconductive materials, as recited in JP-A-60-65582, harmful metals such as alkali earth metals like Ba or alkaline metals, or metals which form a deep level in silicon, are exposed.

Conventionally, normal conductors are used for packaging wirings. The resistance of the packaging wirings produces a delay and prevents increase in the operation speed of the integrated circuit device.

Use of a superconductor as the material for packaging wirings was proposed for solving the delay due to the resistance, in "Superconduction and its Applications" (published May 1986, Sangyo Tosho, Tokyo) pages 161-162. This article, however, does not refer to any concrete technological concepts.

In conventional semiconductor devices, the resistivity of conductive materials used for construction a have low dependence on temperature. The resistance does not change much even when the device is refrigerated to a low temperature. Therefore, the device performances also do not increase much. Refrigeration of a semiconductor device does not always provide a technically high effect.

For forming high temperature superconductor thin films made of sintered material on a substrate, evaporation, sputtering and application and sintering of organic solvent mixed with an organometal compound have been proposed, as recited in Japanese newspaper "Nikkan Kogyo" dated Apr. 24, 1987. Further, for shaping the high temperature superconductor thin film, ion-sputtering etching and wet etching using aqua regia are used.

SUMMARY OF THE INVENTION

This invention relates to an improvement in applying superconductor wirings to single chip integrated circuit devices.

One object of this invention relates to coatings on superconductor wirings.

Another object of this invention relates to control of integrated circuit devices using superconductor wirings.

A further object of this invention relates to a method of fabricating a superconductor wiring.

An object of this invention is to provide an integrated semiconductor device having a superconductor which forms part of resistance at relatively high temperatures (above its $T_c$).

In the prior art, there was no consideration of the reliability of the integrated circuit device which incorporates a superconductive member. Alkaline metals, alkaline earth metals or heavy metals which are part of the constituent elements of the superconductor materials may diffuse into a silicon body or into a silicon oxide body and deteriorate the electrical characteristics of the integrated circuit device. It has been problematic to use superconductor members as wirings in semiconductor integrated circuit devices.

Another object of this invention is to realize a stable and highly reliable wiring for a semiconductor integrated circuit device by using a superconductive material.

The prior art involves sputtering, by a mixture gas of Ar and $O_2$, a thin film of Ba $(Pb_{0.75}Bi_{0.25})O_3$ to a thickness of 200–400 nm on a (1102) face of a single crystal sapphire ($Al_2O_3$) substrate, and then annealing the substrate at 550° C. for 12 hours to make the film super-conductive.

In a large area thin film, there exist many grain boundaries which may lead to such problems as lowering of the critical temperature $T_C$, decrease in the critical current density $J_C$, decrease in the critical magnetic field $H_C$ as the superconductor material, etc.

Another object of this invention is to realize a superconductor thin film on a silicon integrated circuit device in a single chip.

One of the above-mentioned objects can be achieved by coating a superconductor material with an isolation film to prevent leakage (diffusion) of any harmful material into the silicon-containing body of the silicon integrated circuit device from the superconductive material which harmful material is part of the constituent elements of the superconductor material.

Further, another of the above-mentioned objects can be achieved by forming a resistor of a superconductive material, a sensing circuit for sensing changes in the resistance of the superconductive material resistor and a circuit for controlling at least one of the voltage or the current of its output based on the output of the sensing circuit, on a same semiconductor integrated circuit substrate.

Further, another of the above-mentioned objects can be achieved by forming a thin film of a superconductive material and a film coating the superconductive thin film in such a manner that the superconductive material may not give any harm to a silicon substrate and/or to a silicon oxide film, and by forming the thin film of the superconductive material into discrete islands to simplify single crystallization.

Since a superconductive material is coated with a film of $Si_3N_4$, TiN, etc. so that alkaline or alkaline earth metal such as Ba, Sr, K, or heavy metals such as Pb, Cu, depending on the superconductive species, will not leak (diffuse) to the external, of the superconductor material said harmful material will not diffuse into a silicon substrate or into a gate oxide, or into a field oxide. Thus, a stable and highly reliable semiconductor integrated circuit device will be realized while utilizing a wiring, the resistance of at least part of which becomes zero due to the superconductivity.

The resistance of a superconductive material becomes zero at temperatures below the critical temperature $T_C$ and is substantially constant at $R_I$ when the temperature is above the critical temperature $T_C$ by 1°-10° K. Therefore, the value of the ratio of the resistance in the normal state to that in the superconducting state is zero or infinite. This change in the resistance due to a change in the temperature is sensed by a sensing circuit integrated with the same substrate as the resistance of the superconductive material. Either one or both of the current and the voltage of another circuit integrated on the same substrate can be controlled by this output of the sensing circuit, thereby enabling extremely reliable control by the temperature.

Generally speaking, crystallization of a material on an amorphous body into a single crystal becomes easier as the region of the material to be crystallized into a single crystal becomes smaller. The thin film islands of a superconductive material formed in discrete islands pattern will be crystallized in each island. Single-crystallized islands of a first superconductive material are connected with a conductive film of a second material, thereby realizing an extremely low resistance wiring as a whole.

As such superconductive material, perovskite type oxide superconductors have high critical temperatures and hence are expected to be used in various technical fields. These high temperature superconductive materials, however, contain a large proportion of elements having a large diffusion coefficient in silicon such as copper or those which diffuse into silicon and become a p-type impurity such as Ba, Sr, Y, etc. and give unfavorable effects in silicon. Thus, when such a material is brought into contact directly with silicon, there may occur junction breakdown and/or increase in contact resistance, etc. Further, those elements such as Ba, Sr, Y and Cu are easily diffused into silicon oxide, and the diffusion causes formation of a glass. When these elements are in a silicon oxide body, they can move in the silicon oxide under high temperatures and at high electric fields. Thus, such elements will allow changes in the charge induced at the silicon surface and deteriorate the device characteristics. Further, these superconductive materials are sensitive to oxidation and reduction, which may lead to loss of superconductivity.

Another object of this invention lies in the prevention of deterioration of the device, or prevention of changes in the superconductivity as described above, by the heat treatment at or after the formation of the superconductive wiring.

One of the above-mentioned objects can be achieved by providing a barrier layer on a semiconductor body or between a semiconductor body or an oxide film and a superconductive wiring, for blocking diffusion of the constituent elements of the superconductive material or for blocking the reaction of such elements with said film.

Since the oxide superconductive material is coated with a barrier layer, metal elements constituting the oxide superconductive material are prevented from diffusion into a silicon body or into an insulating film. The device is free from deterioration. Since there occurs no oxidation nor reduction, there will be no deterioration of superconductibity.

The prior art method of forming a thin film pattern of a high temperature superconductive material comprised of a sintered body does not pay attention to the miniaturization of the pattern size or to compatibility with semiconductor processing technology. It is a problem how a thin film of a high temperature superconductive material can be applied to a semiconductor integrated circuit device. When said thin film of a high temperature superconductive material is formed on all of the surface of a substrate, and is to be subjected to a desired patterning, there is a problem in the case of using ion sputtering etching, because (1) the mask material should be thick since the etching rate for the mask material and that for the film material are close to each other, and (2) the damage of the underlying substrate surface is large.

When wet etching is employed, the etching rate for the sintered body is not stable and hence the controllability is not very good. Further, formation of fine patterns is difficult since isotropic etching dominates and the sintered body comprises a polycrystalline body comprising grains of about 1 μm.

Another object of this invention is to provide a method for forming a fine pattern of a high temperature superconducting film comprised of a sintered material and to provide a method to facilitate the application of a thin film of a superconductive material to semiconductor integrated circuits.

One of the above-mentioned objects can be achieved by coating an organic, solvent which contains powders of metal oxide, on a substrate, drying said substrate to form a metal oxide powder film, and sintering said metal oxide powder film after shaping it into a desired pattern.

These and other objects and many of the attendant advantages of this invention will be readily appreciated as the same becomes better understood by reference to the following detailed description when considered in connection with the accompanying drawing.

DESCRIPTION OF THE PREFERRED EMBODIMENTS

Embodiments of this invention will be described hereinbelow.

Embodiment 1

Figure 1:
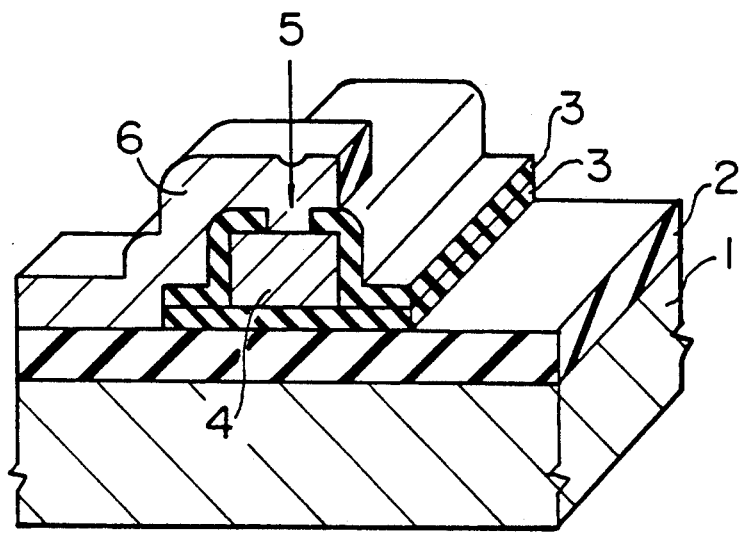
FIG. 1 is a partial cross-sectional perspective view of a semiconductor device according to a first embodiment of this invention.

FIG. 1 shows a semiconductor integrated circuit device according to a first embodiment of this invention.

An MOS type and/or bipolar type integrated circuit is formed in a silicon substrate 1. As usual, a field oxide film 2 of 0.5 to 1.0 μm thick is formed by oxidizing the silicon substrate 1. Then, an isolation film 3, which is typically a silicon nitride film, is deposited to a thickness of about 0.1 μm. A superconductive material such as $Ba(Pb_{0.75}Bi_{0.25})O_3$ which is an oxide superconductive material having the perovskite type crystal structure, $(Sr_{0.05}La_{0.95})_2CuO_4$ or $(Ba_{0.05}La_{0.95})_2CuO_4$ which is an oxide superconductive material having $K_2NiF_4$ type crystal structure, is formed in a film form to a thickness of about 1 μm by using sputtering or chemical vapor deposition (CVD) or the method described accompanied by FIGS. 29A to 29D and FIGS. 30A to 30F. Then, the device is heat-treated at 500°–1300° C., which the device can withstand. When a high power laser or a high current electron beam is used for an extremely short period, it is possible to perform a high temperature heat treatment above 1300° C. which the silicon integrated circuit cannot stand continuously.

By using photolithography technology (including electron beam and X rays), a resist layer is left at desired portions. Then, a wiring of the superconductive material film 4 is formed by sputter-etching or ion-milling as shown in FIG. 1.

Then, another isolation film 3 of about 0.1 μm thick is deposited and patterned by photoetching so that the isolation films 3 covers around the superconductive film 4 as shown in FIG. 1. A contact hole 5 is formed in the upper isolation film 3. A connection electrode 6, which is typically aluminum or aluminum alloy, is deposited thereon. Thus, a wiring of a superconductive material is formed.

Embodiment 2

Figure 2:
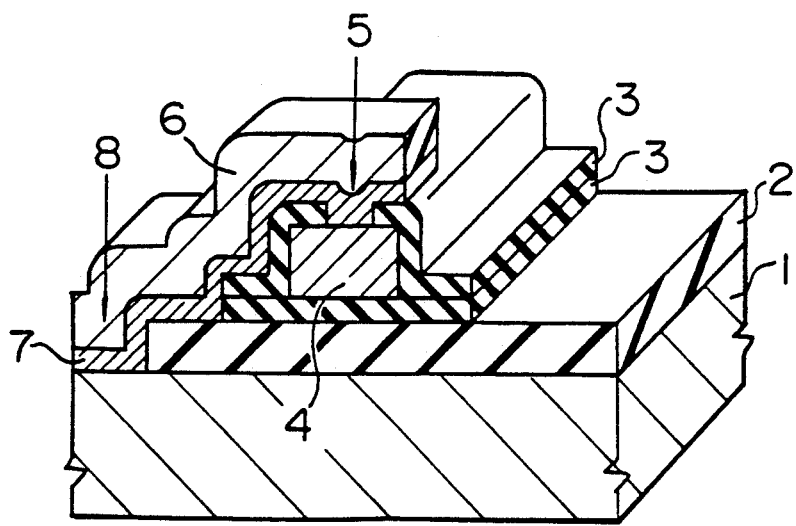
FIG. 2 is a partial cross-sectional perspective view of a semiconductor device according to a second embodiment of this invention.

FIG. 2 shows a semiconductor integrated circuit device according to a second embodiment of this invention. When polycrystalline silicon is used as the connection electrode, and especially when such a polycrystalline silicon electrode makes contact with the silicon substrate 1 through a contact hole 8 as shown in FIG. 2, harmful material contained in the film 4 of the superconductive material may diffuse into the silicon substrate 1 through the connection electrode 6. For preventing such diffusion, a barrier electrode 7, which may be formed of TiN, etc., is formed to a thickness of about 0.1 μm. Then, the connection electrode 6 is formed thereon. The barrier material TiN has a resistivity of about $5 \times 10^{-5}$ Ω·cm, and hence a sufficiently low connection resistance can be obtained. Other nitride of transition metals, such as Zr, Hf, V, Ni, Ta, Cr, W, Mo, can be used to obtain similar effect as obtained by TiN. These other nitrides can be used in a similar manner as TiN.

Embodiment 3

Figure 3:
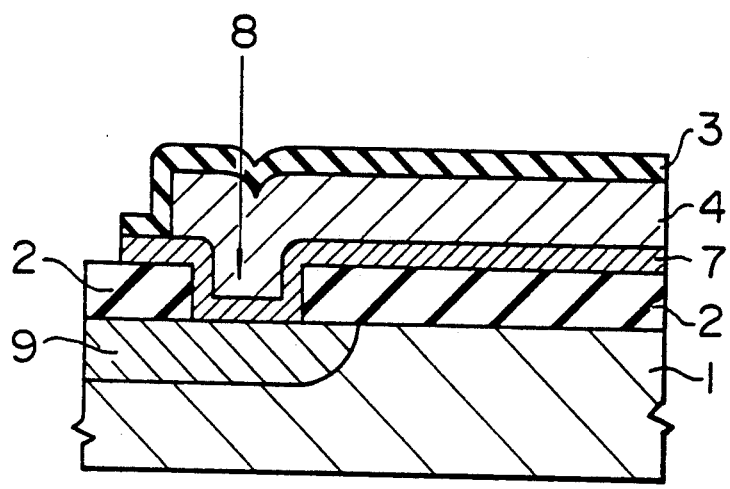
FIG. 3 is a partial cross-sectional view of a semiconductor device according to a third embodiment of this invention.

FIG. 3 shows a semiconductor device according to a third embodiment of this invention. A film 4 of a region 9 formed in a surface region of a silicon substrate 1. A barrier electrode 7 formed of TiN or the like is first deposited as an underlying layer and then the film 4 of a superconductive material is selectively deposited. Then, an isolation film 3 is deposited thereon to seal the superconductive material in the film 4.

Embodiment 4

Figure 4:
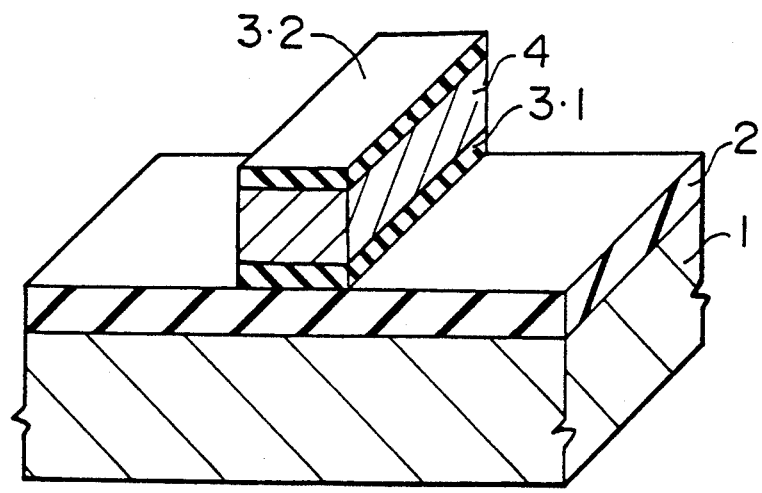
FIGS. 4 and 5 are partial cross-sectional perspective views of a semiconductor device according to a fourth embodiment of this invention.
Figure 5:
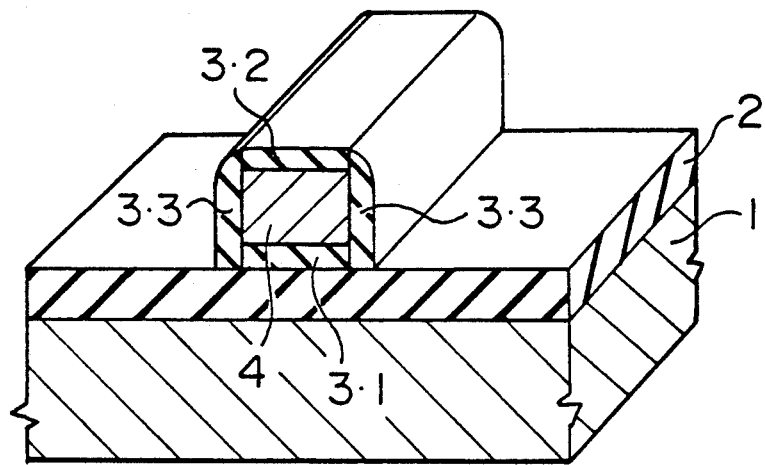

FIGS. 4 and 5 show a semiconductor device in two manufacturing steps according to a fourth embodiment of this invention. In the description on the foregoing embodiments, the isolation film 3 is patterned separately from that of the superconductive film 4. This requires alignment of a photomask and is not preferred for achieving fine wiring.

As shown in FIG. 4, on an isolation film 31, a film 4 of a superconductive material is deposited on the whole surface, and another isolation film 32 is deposited on the whole surface. Then, the upper isolation film 32, the superconductive film 4 and the lower isolation film 31 are processed by photoetching, etc. Then, another isolation film 33 is deposited on all the surfaces and directional or anisotropic dry etching is performed on the whole area, to leave the isolation film 33 only on the side surfaces of the superconductive film 4 as shown in FIG. 5. In this way, all the surfaces of the superconductive film 4 can be covered by isolation films 3 in a self-aligned manner.

For connecting a connection electrode 6, steps to form structure as shown in FIG. 1 or 2 may be employed.

Embodiment 5

Figure 6:
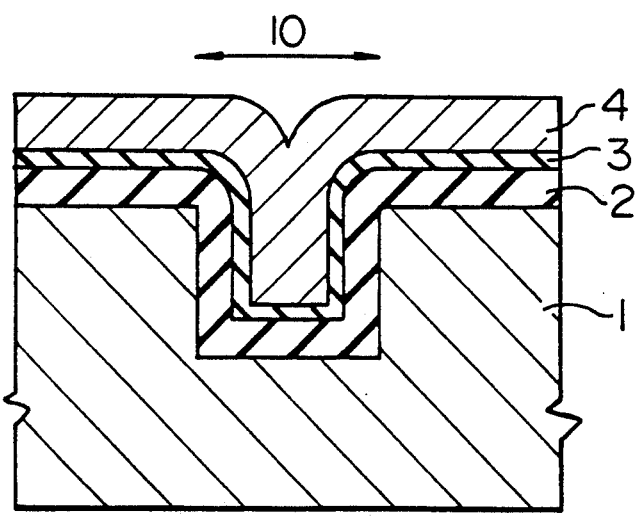
FIGS. 6 and 7 are cross-sectional views of a semiconductor device according to a fifth embodiment of this invention.
Figure 7:
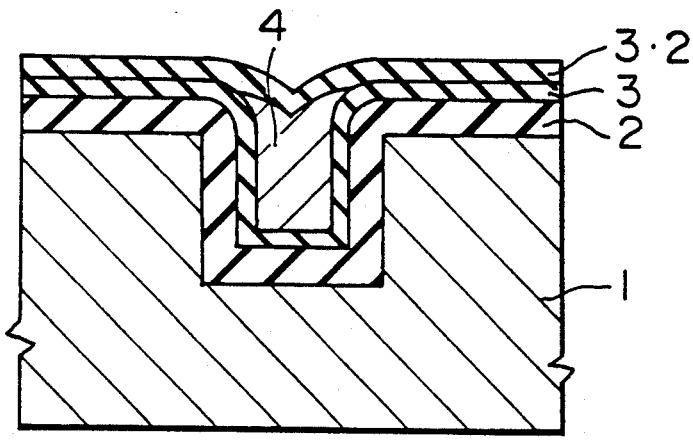

FIGS. 6 and 7 show a semiconductor device in two manufacturing steps for illustrating a fifth embodiment of this invention. As shown in FIG. 6, a groove or trench 10 1 μm deep and 1 μm wide is formed in a silicon substrate 1 by a photoetching process. Then, the substrate surface is thermally oxidized to form a field oxide film 2 of about 0.2 μm thick. Then, an isolation film 3 of about 0.1 μm thick is deposited on the whole surface. A film of superconductive material 4 is deposited to fill the remaining groove.

Thereafter, etching is done on the whole surface to leave the superconductive film 4 only in the groove. Another isolation film 32 is deposited thereon to provide a superconductive wiring 4 totally covered with the isolation film 3, as shown in FIG. 7.

Embodiment 6

Generally, a resistance of a superconductive material film will rapidly increase when the temperature exceeds its critical temperature, below which the resistance of a superconductive film is zero. When a part of the superconductive wiring with zero resistance changes from the superconducting state to the normal conducting state, a rapid heat generation and a resultant cut-off of the wiring may occur at the part.

Figure 8:
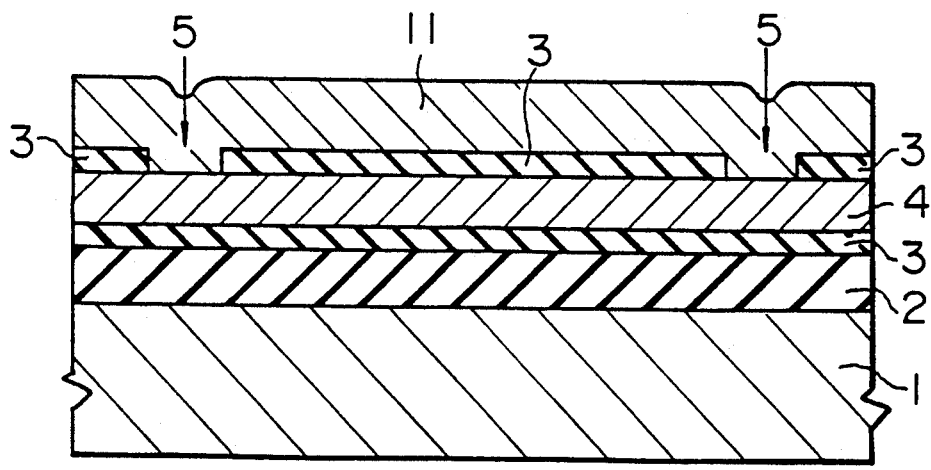
FIG. 8 is a cross-sectional view of a semiconductor device according to a sixth embodiment of this invention.

FIG. 8 shows a semiconductor device according to a sixth embodiment of this invention. In an isolation film 3 covering a film of a superconductive material 4, contact holes 5 are formed at a certain interval. A shunt wiring 11 such as an aluminum film is formed thereon to make contacts with the superconductive film 4 at the contact holes 5. Even when the superconducting state of the superconductive film 4 is partially lost to generate a resistance, a current is readily by-passed through the shunt wiring 11 to avoid destructive failure such as burn-out of the wire.

Embodiment 7

Figure 9:
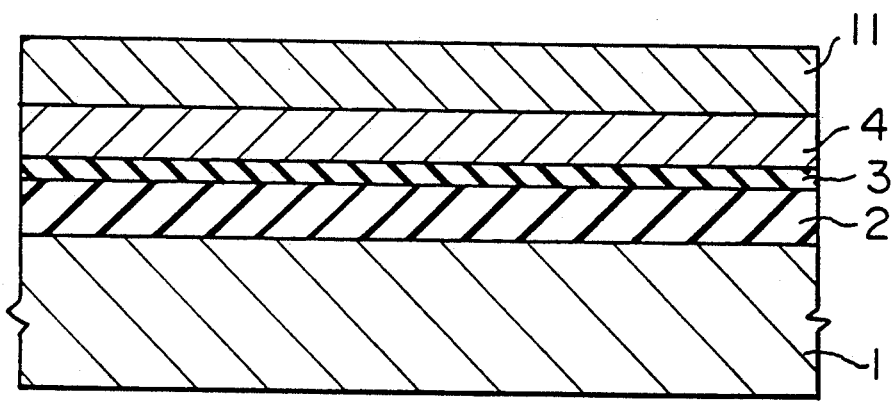
FIG. 9 is a cross-sectional view of a semiconductor device according to a seventh embodiment of this invention.

FIG. 9 shows a semiconductor device according to a seventh embodiment of this invention. A shunt wiring 11 is deposited on the entire length of a film of a superconductive material 4. Electrical contact can be made to the whole surface of the superconductive wiring.

In the structures shown in FIGS. 1 and 2, the isolation film 3 covering all the surfaces of the superconductive film 4 may be replaced with a barrier electrode such as of TiN to realize the embodiment shown in FIG. 9.

Embodiment 8

Figure 10:
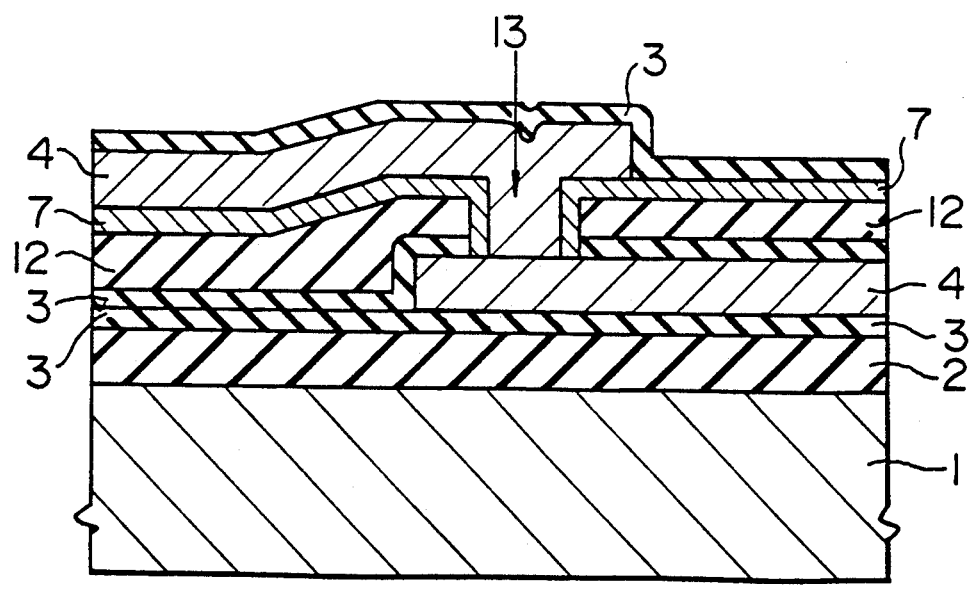
FIG. 10 is a cross-sectional view of a semiconductor device according to a eighth embodiment of this invention.

FIG. 10 shows a semiconductor device according to an eighth embodiment of this invention. A pair of superconductive films 4 are used at two levels. Between the two layers, a inter-layer insulator film 12, typically of silicon oxide film formed by a CVD process, is inserted. For each of the superconductive films 4, an appropriate isolation film 3 and an appropriate barrier electrode 7 may be used. In FIG. 10, there is formed no barrier layer 7 at the bottom of an inter-layer connection hole 13 so that the superconductive films 4 can directly contact each other. If a minute resistance is tolerable, the barrier layer 7 may be left at the bottom of the hole 13.

Embodiment 9

Figure 11:
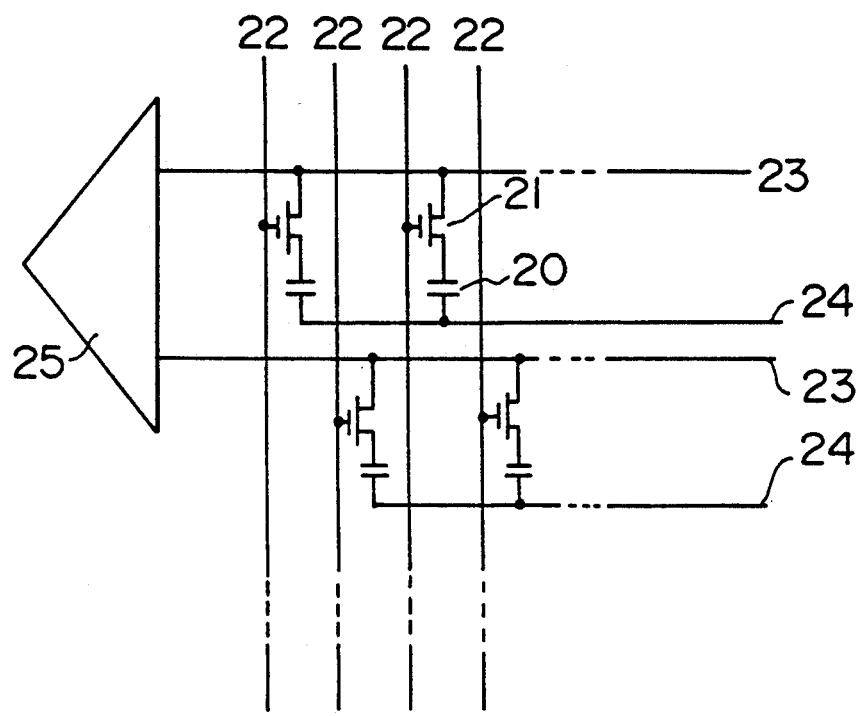
FIG. 11 is a circuit diagram of a dynamic random access memory (DRAM) according to a ninth embodiment of this invention.

FIG. 11 shows a DRAM circuit according to a ninth embodiment of this invention. Generally, in a semiconductor memory device, a multiplicity of memory cells are arranged in a matrix shape to constitute an array. Long word lines 22 and long bit lines 23 are disposed at a high density for writing and reading information into and from these memory cells. For achieving high speed operation of such a memory device, the signal delay due to the resistances in these word lines 22 and bit lines 23 is not negligible. Therefore, in a dynamic random access memory (DRAM) comprising capacitors 20, switching transistors 21 and sense amplifiers 25 as shown in FIG. 11, at least one of the word lines 22, the bit lines 23 and the capacitor plate wirings 24, may be formed of a superconductive film 4 coated with isolation film 3 and/or barrier electrode 7, as described hereinabove.

For improving the reliability, it is preferable to provide shunt wirings as disclosed in embodiments 6 and 7, parallel to the superconductive wirings.

Embodiment 10

Figure 12:
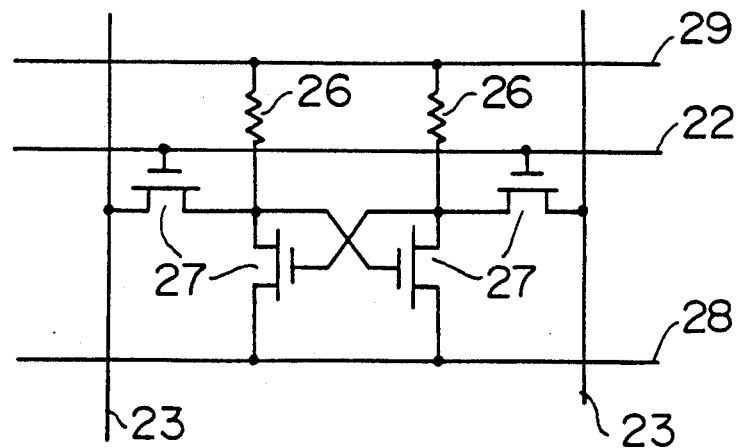
FIG. 12 is a circuit diagram of a static random access memory (SRAM) according to a tenth embodiment of this invention.

FIG. 12 shows an SRAM circuit according to a tenth embodiment of this invention. In a static random access memory (SRAM) comprising a matrix-shaped arrangement of memory cells each of which contains high resistances 26 and four transistors 27, at least one of word lines 22, bit lines 23, source lines 29, and ground lines 28 may be formed of a superconductive film wiring 4 coated with isolation layer 3 and/or barrier electrode 7, as described hereinabove.

The inventive superconductive wiring can be applied similarly to integrated circuits of large scale logic circuits. In such cases, the partial shunt wiring 11 or the total shunt wiring 11 as shown in FIGS. 8 and 9 is also effective.

Embodiment 11

Figure 13:
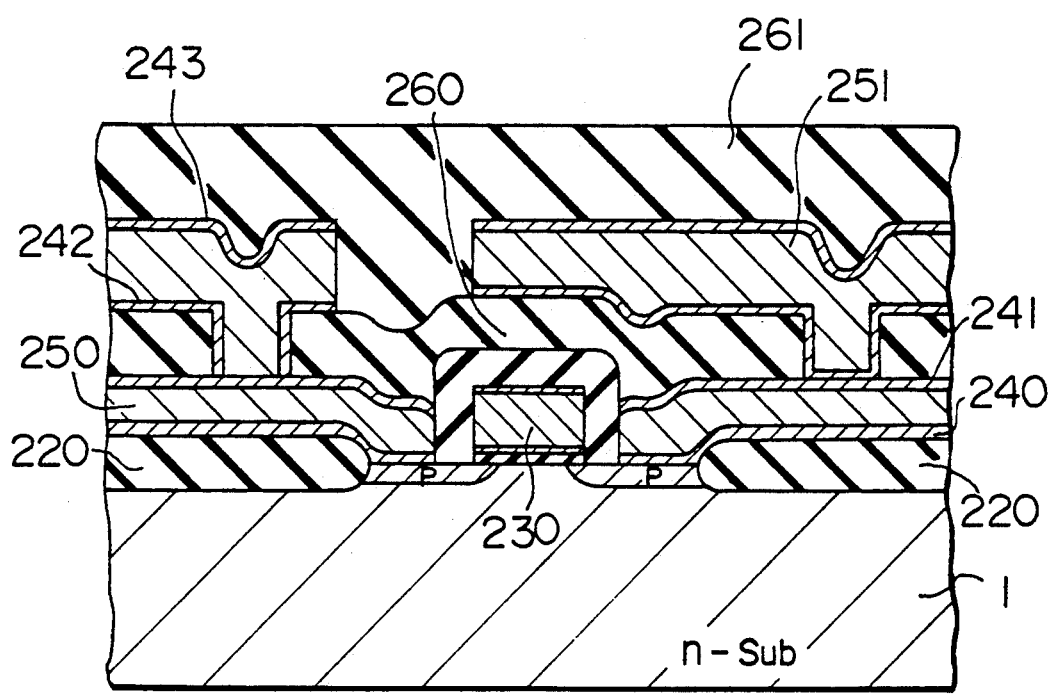
FIG. 13 is a cross-sectional view of a semiconductor device according to an eleventh embodiment of this invention.

FIG. 13 shows a semiconductor device according to an eleventh embodiment of this invention. On a semiconductor substrate 1 formed with source and drain regions, a gate electrode 230 is formed. A lead-out electrode made of a conductor 250 formed of an oxide superconductive material $(La_{1-x}Sr_x)_2CuO_4$ sandwiched between barrier layers 240, 241, e.g. of titanium nitride TiN, is provided from the source/drain regions to a location over the LOCOS oxide film 220. Further thereon, a second layer electrode 251 formed of $(La_{1-x}Sr_x)_2CuO_4$ sandwiched between barrier layers 242, 243 is formed with an oxide film 260 formed as an inter-layer insulation film. Further, an uppermost oxide film 261 is formed thereover.

According to this embodiment, since the superconductive layer of $(La_{1-x}Sr_x)_2CuO_4$ is sandwiched between the titanium nitride (TiN) barrier layers, Cu, La or Sr atoms are prevents from diffusing into the silicon substrate and deteriorating the characteristics or reliability of the devices. Further, there is no possibility that $(La_{1-x}Sr_x)_2CuO_4$ may be reduced to lose the superconductivity. The above description is made on the wirings of MOS transistors. These techniques can also be applied to the wirings of bipolar transistors. Further, the above description can be applied to the multi-layer wiring substrate where there is no diffused regions in the semiconductor substrate. The barrier layer, which was made of a titanium nitride TiN in this embodiment, may be of any material which can block the diffusion of those elements which constitute the superconductive material.

According to this embodiment, since the oxide superconductive material is sandwiched between barrier layers, there is no possibility that the metal element constituting the superconductive material diffuses into or reacts with the silicon body or the silicon oxide body, so that there is no deterioration of the device characteristics and no lowering of the reliability.

Embodiment 12

Figure 14A:
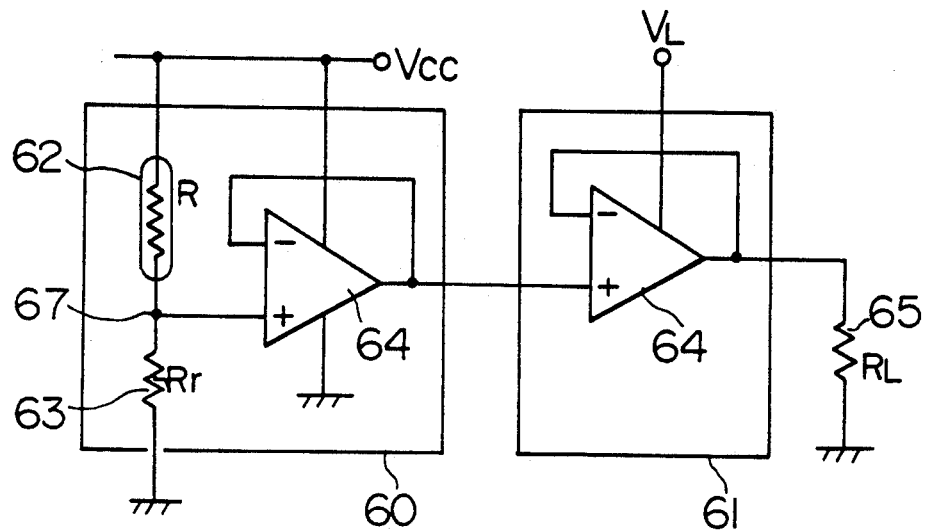
FIGS. 14A and 14B respectively are a circuit diagram of a temperature sensing circuit, and a graph of resistance vs. absolute temperature for a superconductive resistor, for illustrating a twelfth embodiment of this invention.
Figure 14B:
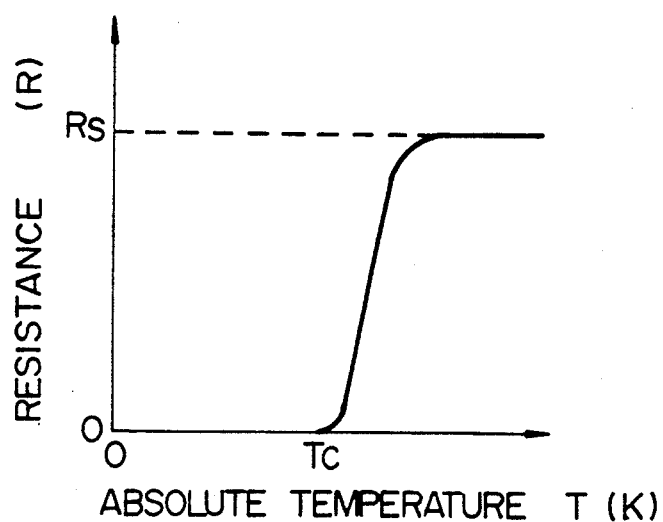

FIG. 14A shows a temperature sensing circuit according to a twelfth embodiment of this invention. A superconductive resistor 62 formed of $BaPb_{0.75}Bi_{0.25}O_3$ which is an oxide superconductive material having the perovskite type crystal structure, $(Sr_{0.05}La_{0.95})_2CuO_4$ or $(Ba_{0.05}La_{0.95})_2CuO_4$ which are oxide superconductive materials having $K_2NiF_4$ type crystal structure, is directly connected with a reference resistance 63 which is a normal resistor and a voltage VCC is applied thereto. When the resistances of these two resistors be R and Rr, the potential at the interconnection 67 of these two resistors will be VCC Rr/(R+Rr). The voltage at this interconnection 67 results in a current which applied to a positive input terminal of a voltage follower constituted of a differential amplifier 64 and the output becomes always of the same potential as the interconnection point 67. Therefore, when the temperature goes below the critical temperature $T_C$, the resistance R of the superconductive resistor 62 becomes zero as shown in FIG. 14B. Here, the potential at the interconnection point 67 becomes $V_{CC}$. The output of the control circuit 61 is also $V_{CC}$. A current of $V_{CC}/R_L$ will flow through the load resistor 65. Here, the supply voltage $V_L$ to the control circuit 61 is $V_L \geq V_{CC}$. If $V_L < V_{CC}$, the current becomes $V_L/R_L$. Although the control circuit 61 of this embodiment is constituted of a voltage follower using a differential amplifier 64, it may be substituted with a simple switch which is closed when the voltage exceeds a predetermined value.

Embodiment b 13

Figure 15:
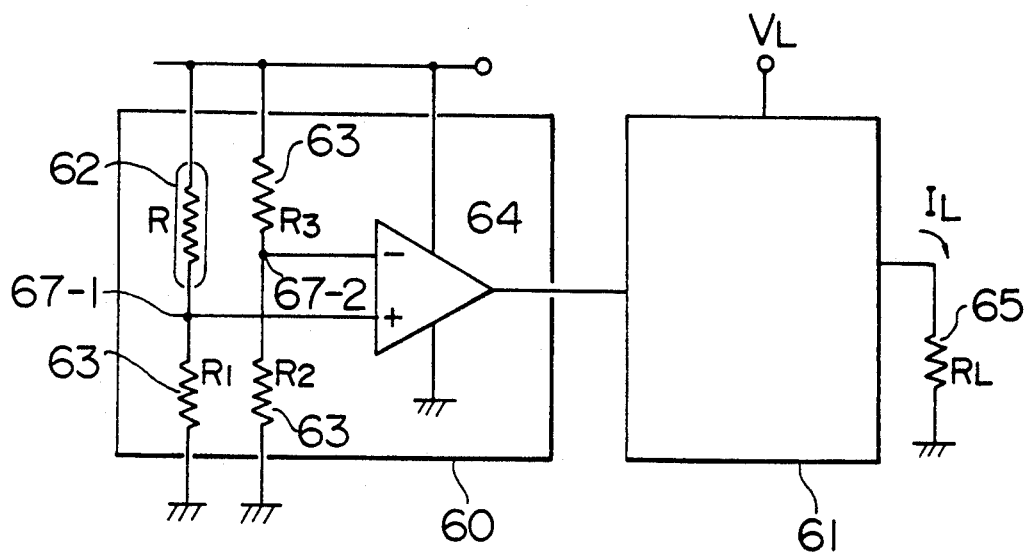
FIGS. 15 and 16 are respectively are a circuit diagram of a temperature sensing circuit, and a graph of current vs. absolute temperature, for illustrating a thirteenth embodiment of this invention.

FIG. 15 shows a temperature sensing circuit according to a thirteenth embodiment of this invention.

A wheatstone bridge is formed of these reference resistors 63 of normal conductor material and one superconductive resistor 62 made of a superconductive material. The resistances of these resistors are set as, $$\frac{R_1}{R_1 + R_S} < \frac{R_2}{R_2 + R_3}, \quad (1)$$

where $R_S$ is the saturation resistance of the superconductive resistor 62 in the normal conducting state.

Figure 16:
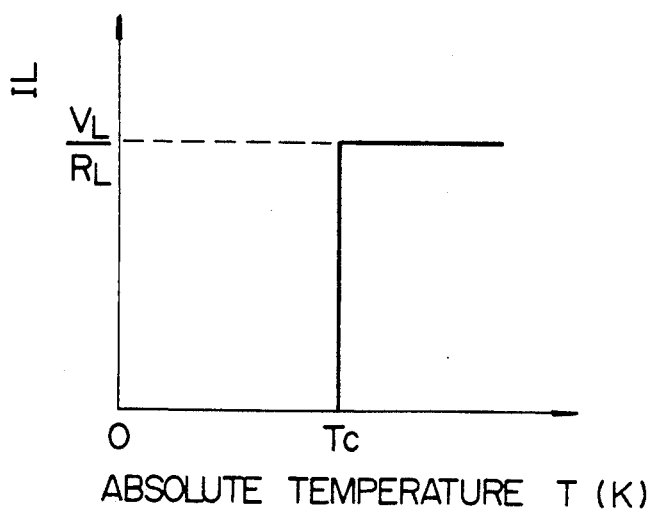

When the superconductor resistance $R_S$ becomes zero, $R_S=0$, i.e. when it takes the superconducting state, the lefthand side of relation (1) becomes unity and hence the inequality symbol in relation (1) should be reversed. Closing a switch upon this change, this switch in the control circuit 61 is closed when the temperature T exceeds the critical temperature $T_C$ and a current of a magnitude $V_L/R_L$ flows through a load resistor 65, as shown in FIG. 16.

Embodiment 14

Figure 17:
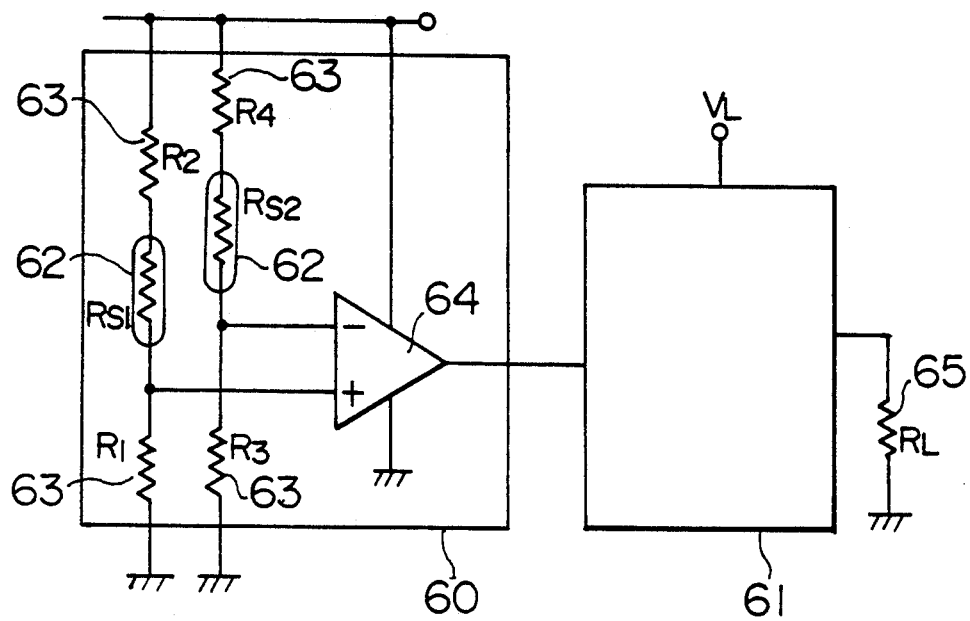
FIGS. 17 and 18 are respectively a circuit diagram of a temperature sensing circuit, and a graph of current vs. absolute temperature, for illustrating a fourteenth embodiment of this invention.

FIG. 17 shows a temperature sensing circuit according to a fourteenth embodiment of this invention.

A wheatstone bridge is formed of two superconductive resistors 62 of superconductive materials and four reference resistors 63 of a normal conductor material. The resistances of the superconductive resistors 62 in the normal conducting state are denoted as $R_{S1}$ and $R_{S2}$. The resistances of the respective resistors are selected to satisfy the relations, $$\frac{R_1}{R_1 + R_2 + R_{S1}} < \frac{R_3}{R_3 + R_4 + R_{S2}}, \quad (2)$$

$$\frac{R_1}{R_1 + R_2} > \frac{R_3}{R_3 + R_4 + R_{S2}}, \quad (3)$$

$$\frac{R_1}{R_1 + R_2} < \frac{R_3}{R_3 + R_4}. \quad (4)$$

Relations (3) and (4) represent the cases when one superconductive resistor becomes superconducting ($R_{S1}=0$) and when the other superconductive resistor also becomes superconducting ($R_{S1}=R_{S2}=0$). Three states with two transition temperatures are established.

Figure 18:
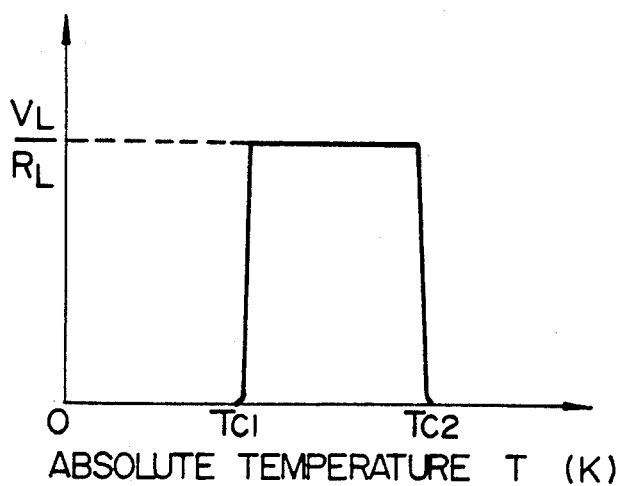

By utilizing the above changes, a switch in the control circuit 61 can be closed only in a temperature range between two critical temperatures $T_{C1}$ and $T_{C2}$ at which the two superconductive resistors 62 become superconducting, and a current of a magnitude $V_L/R_L$ can be allowed to flow through a load resistor 65, as shown in FIG. 18.

An example of the resistances, $R_1$, $R_2$, $R_3$, $R_4$, $R_{S1}$, and $R_{S2}$ which satisfy the relations (2), (3) and (4) are 5Ω, 10Ω, 10Ω, 10Ω, 30Ω, and 30Ω, in this order.

Embodiment 15

Figure 19:
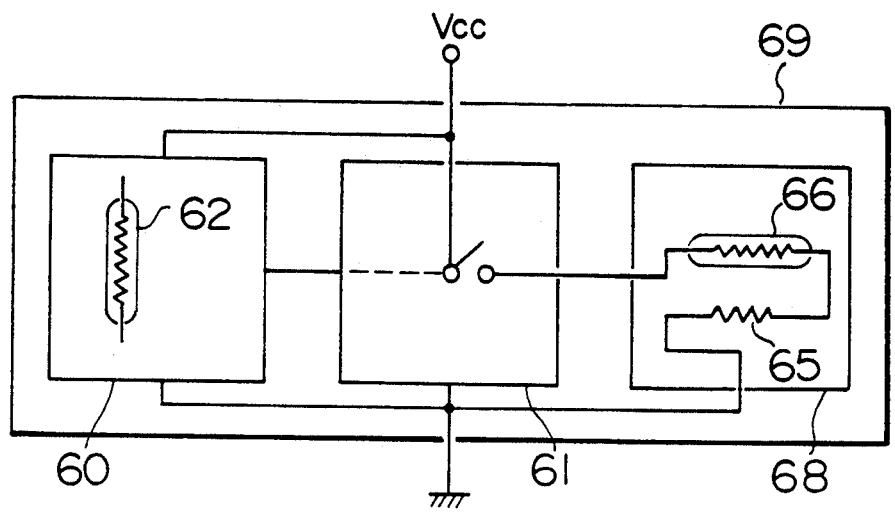
FIG. 19 is a circuit diagram of a power-on protection circuit according to a fifteenth embodiment of this invention.

FIG. 19 shows a protection circuit according to a fifteenth embodiment of this invention.

An integrated circuit 69 includes a superconductive wiring 66 which has a critical temperature $T_{C1}$, and a superconductive resistor 62 which has a critical temperature $T_{C2}$.

If a power source is connected to a superconductive wiring 66 at a still high temperature T at which the superconductive wiring 66 is not in the superconducting state, i.e. $T > T_{C1}$, the resistance $R_{S1}$ of the superconductive wiring 66 in the normal conducting state may cause a large heat generation and may lead to destruction of the superconductive wiring 66.

For avoiding such danger, a temperature sensing circuit 60 and a control circuit 61 achieves control so that a power source $V_{CC}$ will not be connected to the main part 68 of the integrated circuit 69 unless the temperature T becomes below the critical temperature $T_{C1}$.

The critical temperature $T_{C2}$ of the superconductive resistor 62 used in the temperature sensing circuit 60 is selected to be $T_{C1} > T_{C2}$. The temperature sensing circuit 60 may be formed as in Embodiment 13 shown in FIG. 15.

Embodiment 16

Figure 20:
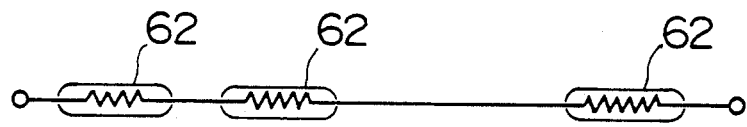
FIGS. 20, 21 and 22 are respectively a schematic circuit diagram of a temperature sensor, a graph of series resistance vs. absolute temperature, and a graph of resistance of a superconductive resistor vs. absolute temperature, for illustrating a sixteenth embodiment of this invention.
Figure 21:
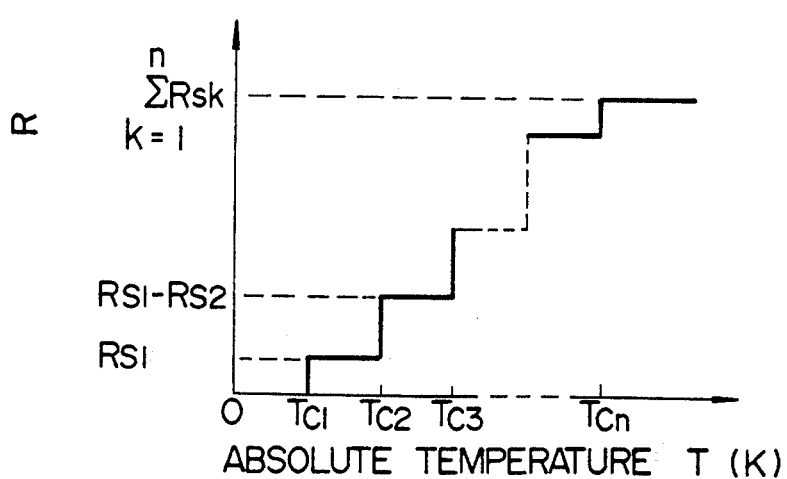

FIG. 20 shows a temperature sensitive resistor according to a sixteenth embodiment of this invention. As shown in FIG. 20, n superconductive resistors 62 of different critical temperature $T_C$ are connected in series. The critical temperatures and the resistances in the normal conducting state for the respective superconductive resistors are denoted as $T_{C1}$, $T_{C2}$, ... $T_{Cn}$, and $R_{S1}$, $R_{S2}$, ... $R_{Sn}$. The total series resistance R changes stepwise with respect to the temperature T, as shown in tures $T_{C1}$, $T_{C2}$, ... $T_{Cn}$ and detecting the total series resistance R, the ambient temperature T can be detected.

Figure 22:
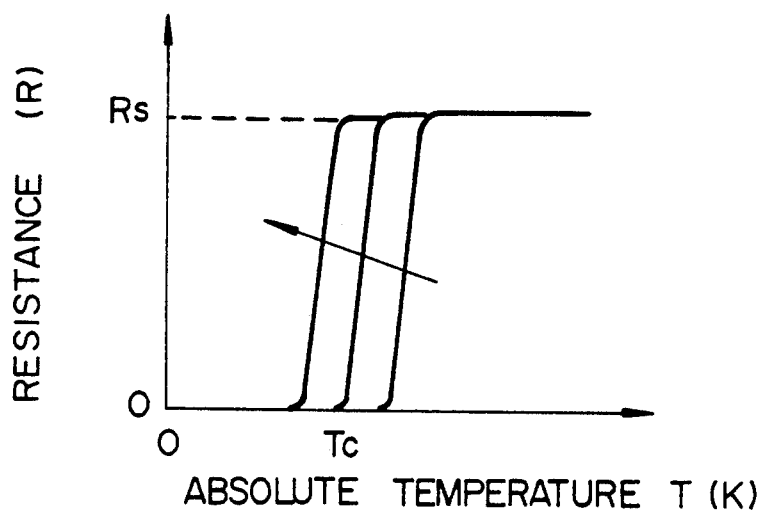

Generally, the critical temperature $T_C$ of a superconducting material changes depending on the current density J flowing therethrough and the change in the resistance R also shifts substantially parallelly, as shown in FIG. 22. The resistance $R_S$ of the superconductive resistor in the normal conducting state is substantially constant. The critical temperature $T_C$ can thus be controlled by the current I.

Embodiment 17

Figure 23:
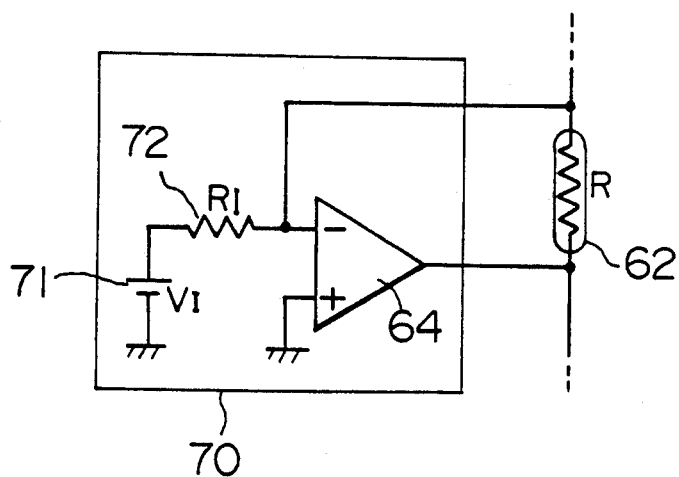
FIG. 23 is a circuit diagram of a current adjusting circuit illustrating a seventeenth embodiment of this invention.

FIG. 23 shows an adjusted current source according to a seventeenth embodiment of this invention. A stabilized current source is formed with a differential amplifier 64 to form a current control circuit 70. Letting the voltage of a setting voltage source 71 for setting a current be $V_1$, a current I flowing through a superconductive resistor 62 is expressed as $$I = \frac{V_1}{R_1}. \tag{5}$$

A desired current level can be set by changing the voltage $V_1$ and hence enabling the setting of the critical temperature $T_C$ as already explained in connection with FIG. 22. This embodiment can be applied to any of the embodiments shown in FIGS. 13, 15, 17, 19 and 21 and can be used to adjust the critical temperature $T_C$.

The characteristics of a superconductive material are sensitive to its crystal structure. When a certain element is implanted by ion implantation, such characteristics as the critical temperature $T_C$, etc. can be changed. When superconductive resistors of different critical temperature $T_C$ are required in a single integrated circuit, different characteristics can be realized by implanting ions in one of the resistors and/or changing an implantation parameter such as the dose and the accelerating energy.

Further, when a high power laser beam is selectively irradiated on a superconductive resistor, characteristics of the superconductive resistor, especially the critical temperature $T_C$, can be varied in a single integrated circuit device depending on the quantity of irradiation.

As described before, since the superconductive materials include an alkaline earth metal such as Ba, Sr, or a metal, such as Pb or Cu, which forms a deep level in semiconductors, typically silicon, it is better to coat the superconductive resistors with isolation films of $Si_3N_4$, TiN, etc., according to necessity. By such arrangement, superconductive materials can become compatible with silicon integrated circuits.

Further, as a general nature, the critical temperature $T_C$ of a superconductive material increases when a magnetic field is applied. The critical temperature can be adjusted or changed by applying a magnetic field, in place of the current in the embodiment shown in FIG. 23.

Embodiment 18

Figure 24:
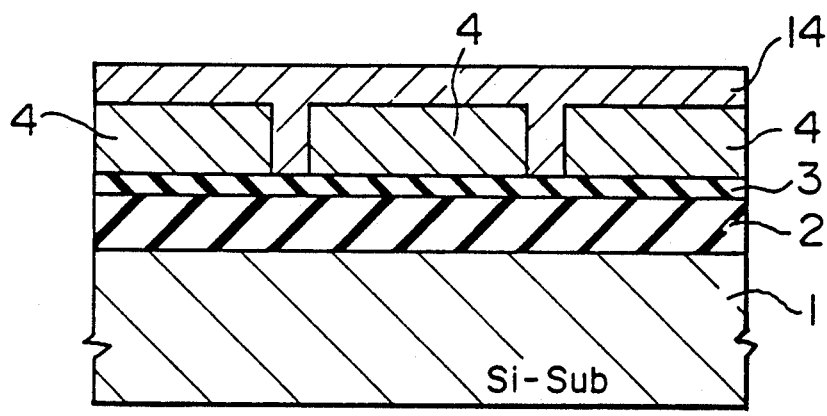
FIG. 24 is a cross-sectional view of a semiconductor device according to an eighteenth embodiment of this invention.

FIG. 24 shows a semiconductor device according to an eighteenth embodiment of this invention.

A silicon substrate 1 is thermally oxidized to form a field oxide film 2 of 1 μm thick. An isolation film 3 typically formed of silicon nitride $Si_3N_4$ and having a thickness of 0.1 μm is formed on the field oxide film 2, to prevent invasion of alkaline metal, alkaline earth metal, heavy metal or transition metal, which is part of the constituent elements of a superconductive film 4 to be formed thereon, into the silicon substrate 1 and/or field oxide film 2. A film of a superconductive material 4 is formed thereon and patterned to leave discrete islands of superconductive film 4, as shown in FIG. 24. The superconductive material may be Ba $(Pb_{0.75}Bi_{0.25})O_3$ which is an oxide superconductor having the perovskite type crystal structure, or $(Sr_{0.05}La_{0.95})_2CuO_4$ or $(Ba_{0.05}La_{0.95})_2CuO_4$ which are oxide superconductors having the $K_2NiF_4$ type crystal structure. Thereafter, heat treatment is performed at a most appropriate temperature depending on the material of the superconductive film to make the crystal grains of the superconductive film large or to crystallize the superconductive film into single crystals. Usually, silicon melts at around 1420° C. Also, such drawbacks as expansion of diffused regions occur when a silicon integrated circuit device is heated above 1200° C. Thus, heat treatment between 1200° and 1420° C. or above is difficult. When a high output laser or a large current electron beam is used for a very short period, it becomes possible to perform heat treatment at a temperature above 1200° C., which silicon integrated circuit devices cannot withstand in a stationary state.

Then, a connection conductor film 14 formed of TiN which has a resistivity of about $5 \times 10^{-5}$ Ω·cm is deposited to connect the discretely formed superconductive film islands 4. Other materials which can provide similar effects as that of titanium nitride TiN involve pure metals such as Al, Cu, W, Mo, mixture of these metals, nitrides and silicides of transition metals such as Zr, Hf, V, Ni, Ta, Cr, Mo, W.

Embodiment 19

Figure 25:
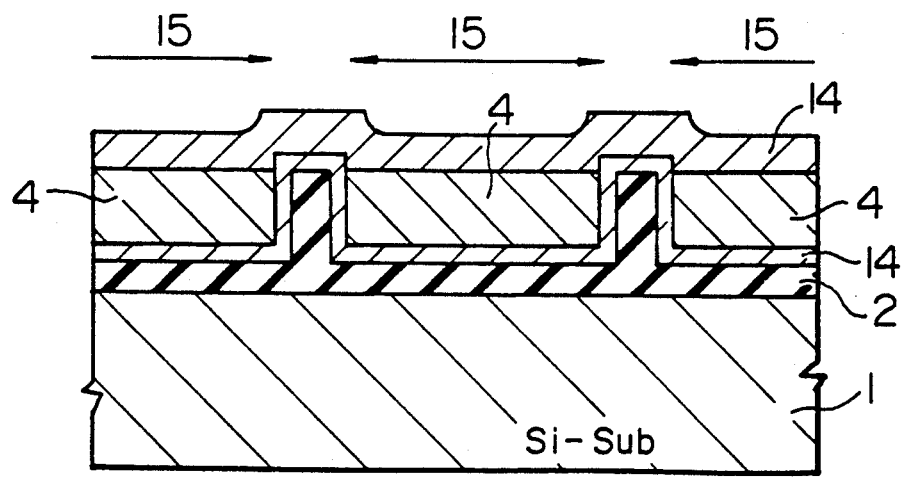
FIG. 25 is a cross-sectional view of a semiconductor device according to a nineteenth embodiment of this invention

FIG. 25 shows a semiconductor device according to a nineteenth embodiment of this invention, in which recessed portions 15 are discretely formed in a field oxide film 2 which is formed on a silicon substrate 1, and superconductive material film 4 is embedded in these recesses. For forming such a structure, a so-called "etch-back" method is appropriate where after a superconductive film 4 is deposited on the whole surface, a smoothing or flattening film is applied and etching is done on the whole surface to each off those protruding portions of the superconductive film 4.

Thereafter, heat treatment as explained in connection with the embodiment shown in FIG. 24 is carried out to make the crystal grains of the polycrystal of the superconductive film large or to crystallize the polycrystal of the superconductive film 4 into single crystals. A connection conductor film 14 may be deposited on the whole surface, thereafter.

Embodiment 20

Figure 26:
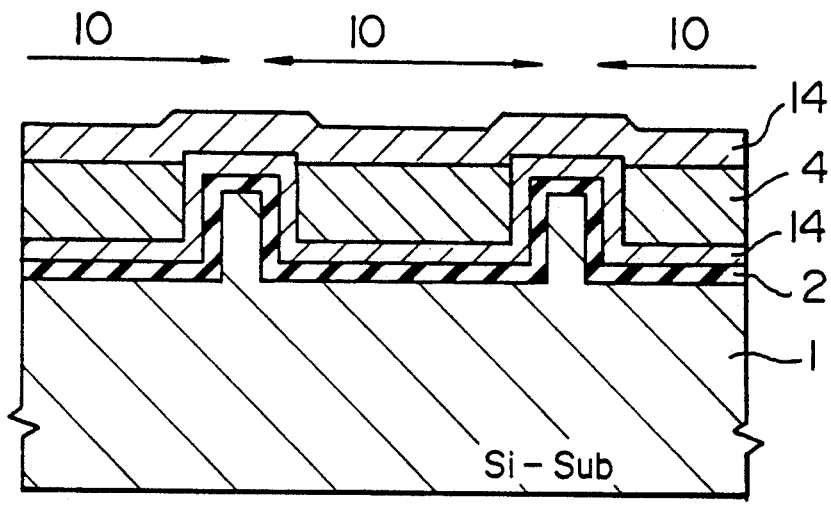
FIG. 26 is a cross-sectional view of a semiconductor device according to a twentieth embodiment of this invention.

FIG. 26 shows a semiconductor device according to a twentieth embodiment of this invention.

Grooves 10 are engraved in a silicon substrate 1. A field oxide film 2 is formed on the whole surface. A connection conductor film 14 is deposited on the field oxide film 2. Then, a superconductive material film 4 is deposited on the surface to fill the remaining recessed portions. Heat treatment is carried out to crystallize the superconductive film 4 into a single crystal or to grow the crystal grains of the polycrystal large. A connection conductor film 14 may be deposited thereafter.

Embodiment 21

Figure 27:
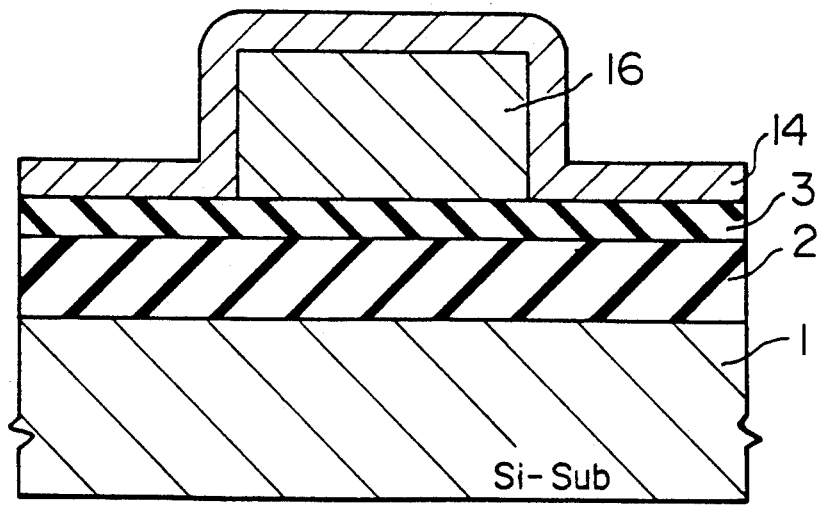
FIGS. 27 and 28 are cross-sectional views of a semiconductor device according to a twenty-first embodiment of this invention.
Figure 28:
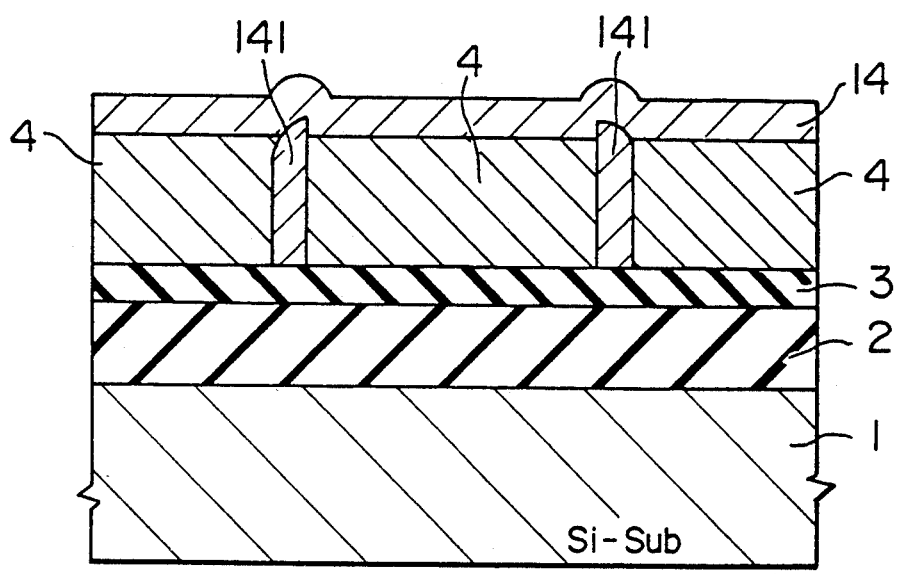

FIGS. 27 and 28 show a semiconductor device according to a twenty-first embodiment of this invention.

As shown in FIG. 27, a field oxide film 2 is formed on a silicon substrate 1. An isolation film 3 is deposited on the whole surface and a silicon oxide film 16 is deposited by CVD to a thickness of about 1 $\mu$m. Then, the CVD oxide film 16 is selectively etched. A connection conductor film 14 is deposited thereon.

Then, directional dry etching is performed on the whole surface of the connection conductor film 14 to etch off the film 14 except those portions disposed on the side surface of the CVD oxide film 16. Then, the CVD oxide film 16 is removed in a fluoric acid solution to leave the connection conductor film 141. Then, a superconductive film 4 is deposited, embedding the connection conductor film 141, as shown in FIG. 28. The thin connection conductor film 141 is connected to a whole cross-section of the superconductive film 4. The resistance in the wiring can be made smaller compared to other embodiments shown in FIGS. 1 to 3. A further connection conductor film 14 may be deposited on the whole surface.

Characteristic embodiments of the semiconductor devices according to this invention have been described. Combinations of two or more embodiments are indeed possible to provide the merits of combined embodiments.

Superconductive resistor or resistors can be incorporated in a semiconductor integrated circuit. A circuit controlled by the temperature can be realized. It is suited for operating an integrated circuit at low temperatures.

Further, the resistance of the wiring in an integrated circuit can be reduced to about zero and hence high speed circuit operation is enhanced and power loss due to wiring resistance can be reduced.

Further, a superconductive material film of single crystal or of polycrystal of enlarged crystal grains can be formed with good controllability. Thus, wirings of extremely low resistances can be provided. Integrated circuits employing such wirings are effective in reduction of power loss and in improvement of signal transfer speed.

Embodiment 22

FIGS. 29A to 29D illustrate a twenty-second embodiment of this invention. A superconductive film pattern will be formed.

Figure 29A:
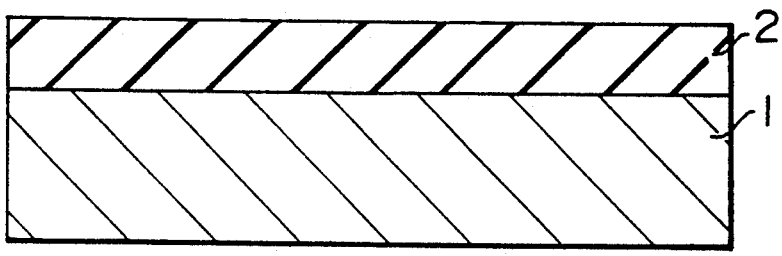
FIGS. 29A to 29D are cross-sectional views of a semiconductor device for illustrating a twenty-second embodiment of this invention.

As shown in FIG. 29A, an organic solvent containing metal oxide powder is applied on the whole surface of a silicon substrate 1 to form a metal oxide powder coating film 2 of a predetermined thickness.

Figure 29B:
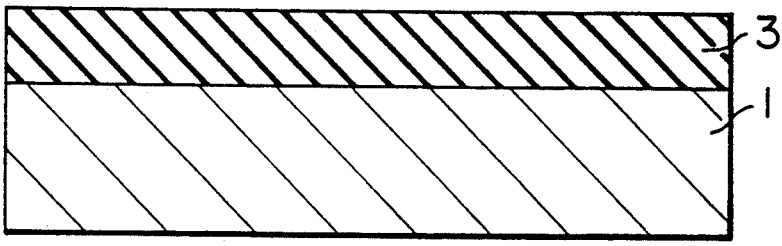

Then, as shown in FIG. 29B, the silicon substrate 1 is heated to evaporate the organic solvent and water contained in the coating film 2 and densify the coating film 2 to form a metal oxide powder film 3.

Figure 29C:
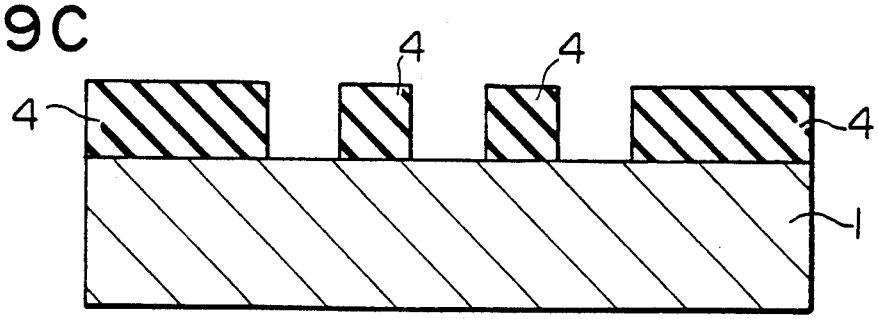

As shown in FIG. 29C, the metal oxide powder film 3 is patterned by a photolithographic process to form a metal oxide powder film pattern 4 having a desired pattern shape.

Figure 29D:
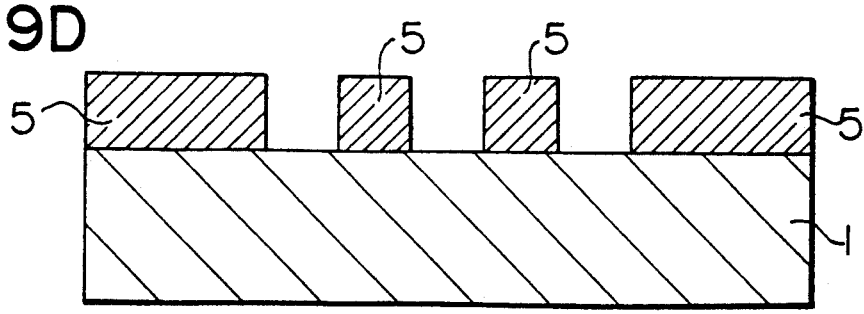

Then, as shown in FIG. 29D, the silicon substrate 1 is heated to a high temperature to sinter the metal oxide powder film pattern 4 to form a superconductive material film pattern 5.

In the above-described processes, the step of applying an organic solvent containing metal oxide powder may be the same as used in applying a film in a conventional manufacturing process of a semiconductor device. The heating step for densifying the metal oxide powder coating film 2 may be well achieved in a temperature range similar to those used in the conventional heating step for hardening the photoresist films. Further, the step of forming the metal oxide powder film pattern 4 may be an ordinary photolithographic process as used in the conventional manufacturing process of semiconductor devices, which realizes the minimum dimension of 0.3 $\mu$m, or an ordinary electron beam lithographic process, which can realize fine patterns with a minimum dimension of less than 0.1 $\mu$m.

In other words, according to the above-described manufacturing process of the superconductive film pattern, by performing patterning before sintering the metal oxide powder film at a high temperature, manufacture of a superconductive film pattern having a desired pattern width on a silicon substrate is made easy.

Thus, this embodiment has a very large technical effect when a superconductive film is to be formed on a semiconductor substrate forming a semiconductor integrated circuit device.

Embodiment 23

FIGS. 30A to 30F show a twenty-third embodiment of this invention.

FIGS. 30A to 30F show various steps in the manufacture of a field effect transistor having a wiring region or regions formed of a superconductive material. Now, the steps will be described in order.

Figure 30A:
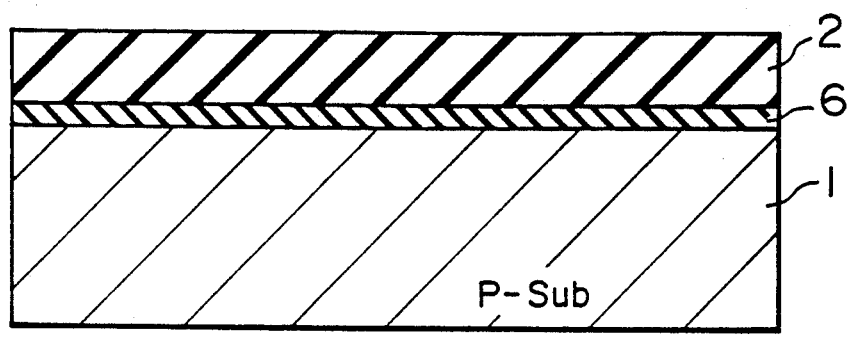
FIGS. 30A to 30F are cross-sectional views of a semiconductor device for illustrating a twenty-third embodiment of this invention.

Referring to FIG. 30A, in a region of a p-type (100) oriented silicon substrate 1 of a resistivity 10 $\Omega$·cm, where a field effect transistor is to be formed, a gate oxide film 6 of a thickness 20 nm is first formed by thermal oxidation at 1000° C. in a dry oxygen atmosphere for 20 minutes. Then, cyclohexane ($C_6H_{10}O$) solvent mixed with a predetermined amount of powders of yttrium oxide ($Y_2O_3$), barium carbonate ($BaCO_3$), and copper oxide (CuO) is spin-coated on the substrate 1 to form a metal oxide powder coating film 2 of about 1 $\mu$m in thickness.

Figure 30B:
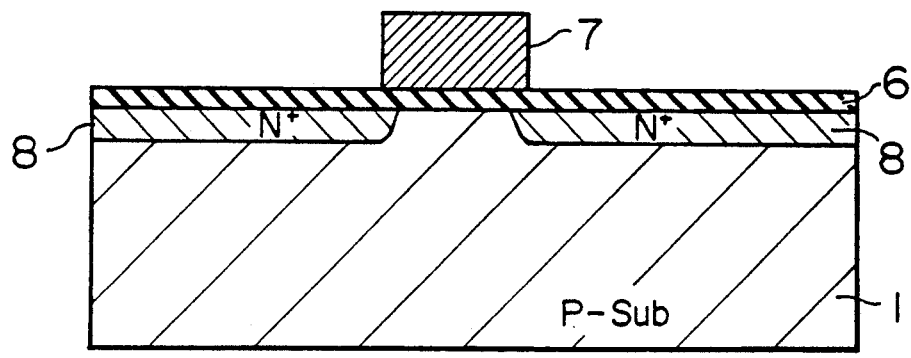

Then, referring to FIG. 30B, the metal oxide powder coating film 2 is baked at 200° C. in an oxygen atmosphere for 10 minutes. Through a photolithographic process and wet etching in aqua regia at room temperature (23° C.) for 20 minutes, a pattern with a pattern width of 2 $\mu$m is formed. Then, sintering is done at 950° C. in an oxygen atmosphere for 3 hours to form a superconductive gate electrode 7. Further, using the superconductive gate electrode 7 as a mask, arsenic (As) ions are implanted into the silicon substrate 1 at an acceleration energy of 30 KeV and a dose of $3 \times 10^{15}$ atoms/cm$^2$, to form highly doped regions 8.

Figure 30C:
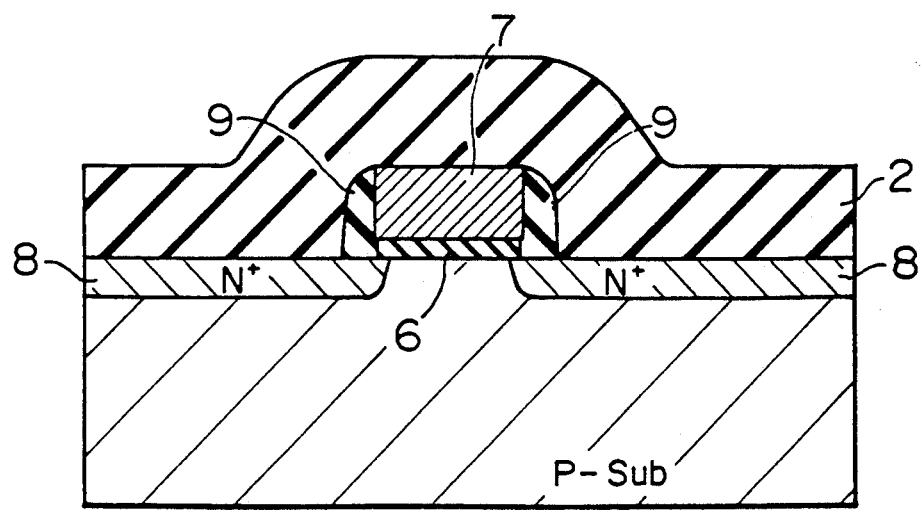
Figure 30D:
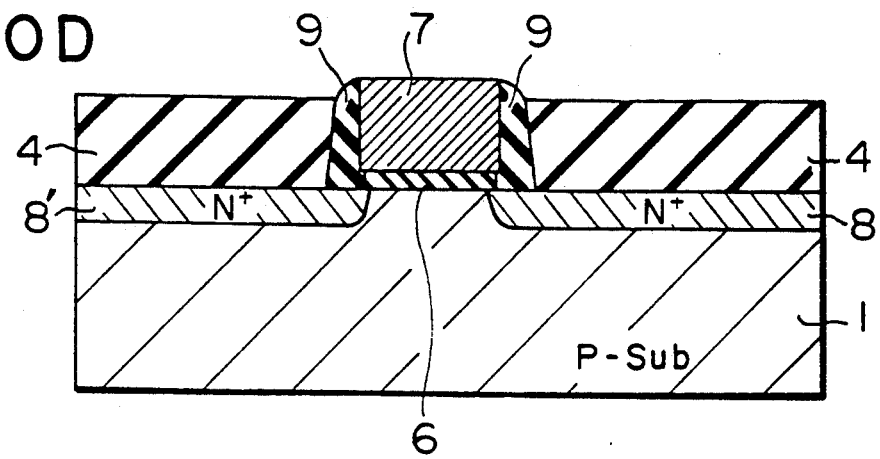

Then, referring to FIG. 30C, an oxide film 9 is deposited by chemical vapor deposition and is directionally etched by dry etching such that the oxide film 9 is left only on the side surface of the superconductive gate electrode 7. Then, by a similar process as used in forming the metal oxide powder coating film 2, another metal oxide powder coating film 2 of about 1 μm in thickness is formed. Further, through a photolithographic process and wet etching in aqua regia, a metal oxide powder film pattern 4 is formed as shown in FIG. 30D.

Figure 30E:
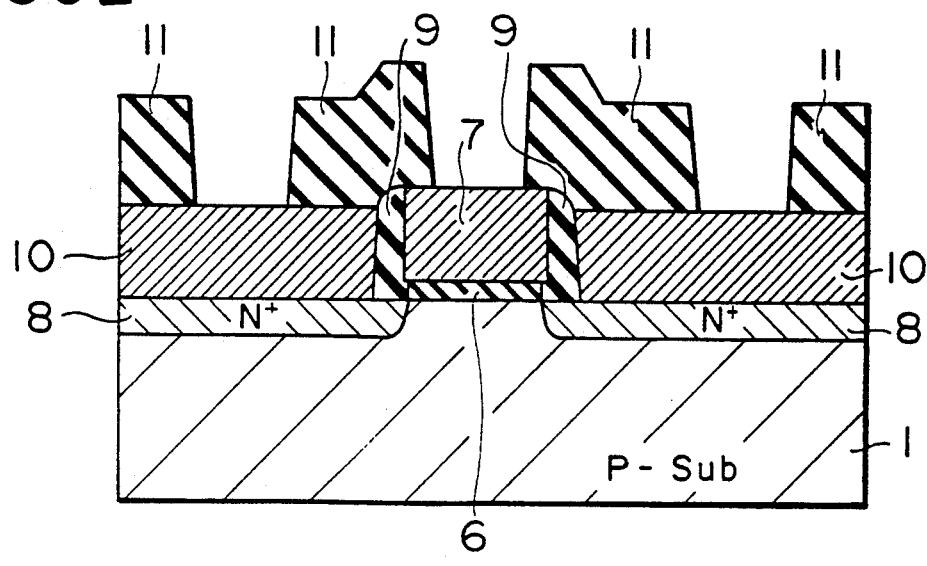

Then, referring to FIG. 30E, the metal oxide powder pattern 4 is sintered at 800° C. in an oxygen atmosphere for 3 hours to form a superconductive electrode 10. Then, an inter-layer insulator film 11 is formed and subjected to a photolithographic process to form contact holes.

Figure 30F:
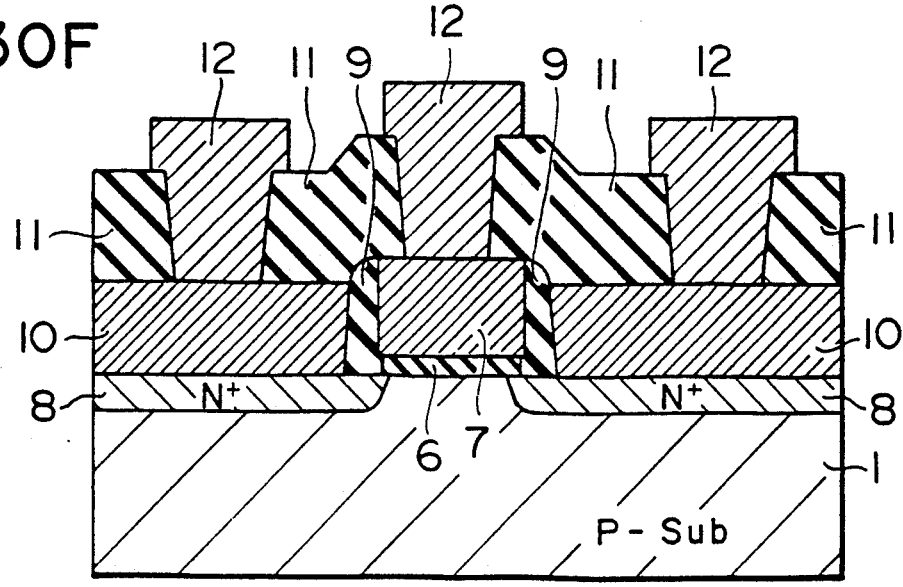

Referring to FIG. 30F, another set of processes similar to the formation of the superconductive gate electrode 7 as shown in FIG. 30B is performed. Namely, a metal oxide powder coating film is formed, patterning of this film is done by a photolithographic process, and the resultant film pattern is sintered at 800° C. in an oxygen atmosphere for 3 hours to form superconductive wirings 12 of a line width of 2 μm. Thus, a field effect transistor is completed.

Field effect transistors manufactured through the above-described processes were subjected to measurements of electrical characteristics. At room temperature (23° C.), normal transistor characteristics were exhibited. Thus, it is confirmed that the respective superconductive conductor patterns were formed without any breaking of wiring. Then, the transistors were refrigerated by liquid nitrogen (77°K). The respective superconductive conductor patterns were assumed to take the superconducting state. Compared to the room temperature data, the wiring resistance was reduced to about 1/10 times and the switching speed of the transistor increased about ten times.

As described above, it becomes possible to easily introduce formation of a fine pattern of high temperature superconductive film formed of a sintered body in the processes of manufacturing a field effect transistor in a silicon substrate. Thus, the method of forming a superconductive film pattern as described above has high technical merits in applying a sintered high temperature superconductive film in a semiconductor device. It will form an industrially important technology.

In the above-embodiment, a field effect transistor was formed in a silicon substrate. It goes without saying that other semiconductor substrates such as compound semiconductor substrates of GaAs, InSb, InP, etc. can similarly be used to enjoy the technical advantage of this invention. Also, it goes without saying that the metal oxide powder coating film 2 can be dry etched, e.g. with chlorine series gas, fluorine series gas, etc. in place of wet etching.

According to the above embodiments, a fine pattern of high temperature superconductive film formed of a sintered body can be easily formed on a semiconductor substrate. Thus, it becomes possible to easily apply the superconductive film to a semiconductor integrated circuit device. Thus, higher performance of such semiconductor integrated circuit device can be achieved.

Although it is not referred to in the above embodiment that a barrier layer and/or isolation layer can be provided, it will be apparent that embodiment 22 or 23 can be applied at the time of forming the superconductive material.

It is further understood by those skilled in the art that the foregoing description is a preferred embodiment of the disclosed device and that various changes and modifications may be made in the invention without departing from the spirit and scope thereof.

We claim:

1. A semiconductor integrated circuit comprising:
    a body including silicon;
    a high-$T_c$ superconductive material positioned overlying said body, said superconductive material adapted to be superconducting during operation of the semiconductor integrated circuit; and
    an isolation member, of a material preventing diffusion of constituent elements of the superconductive material into the body, coating said superconductive material, and positioned between the body and superconductive material so as to prevent the constituent elements of said superconductive material from diffusing into said body from said superconductive material, whereby degradation of the integrated circuit, due to constituent elements of the superconductive material diffusing into said body, is avoided, wherein said isolation member includes a nitride.

2. A semiconductor integrated circuit as described in claim 1, wherein said superconductive material contains at least one of alkaline metal, alkaline earth metal, and a metal forming a deep level in said body, said isolation member preventing diffusion of said at least one of alkaline metal, alkaline earth metal and a metal forming a deep level in said body from the superconductive material into said body.

3. A semiconductor integrated circuit as described in claim 1, wherein said nitride includes a compound selected from the group consisting of silicon nitride and a nitride of a transition metal.

4. A semiconductor integrated circuit as described in claim 1, further comprising
    a film of conductive material different from said superconductive material, making electrical contact at least at selected portions of said high Tc superconductive material.

5. A semiconductor integrated circuit as described in claim 1, further comprising:
    a plurality of discrete islands formed of a first superconductive material; and
    a conductive film formed of a second conductive material and electrically connecting said plurality of discrete islands.

6. A semiconductor integrated circuit as described in claim 1, further comprising:
    a superconductive resistor circuit including a film of a superconductive material; and
    a temperature sensing circuit for sensing a temperature change by a change in resistance of said superconductive resistor circuit.

7. A semiconductor integrated circuit as described in claim 6, wherein said superconductive resistor circuit includes at least two superconductive resistors of different critical temperature.

8. A semiconductor integrated circuit as described in claim 6, further comprising a control circuit for controlling at least one of voltage and current of an output based on the output of said temperature sensing circuit.

9. A semiconductor integrated circuit as described in claim 6, further comprising an adjusting circuit for supplying a current of an adjusted level to said superconductive material, thereby adjusting the critical temperature of said superconductive material.

10. A semiconductor integrated circuit as described in claim 7, wherein said at least two superconductive resistors respectively have a common main component and are doped with different kinds of impurities.

11. A semiconductor integrated circuit as described in claim 7, wherein said at least two superconductive resistors have a common main component and have been subjected to different thermal treatment in forming the respective superconductive resistor, so as to from superconductive resistors with different critical temperatures.

12. A semiconductor integrated circuit as described in claim 6, further comprising
a source of magnetic field for applying a magnetic field of adjusted field intensity to said superconductive material, thereby adjusting the critical temperature of said superconductive material.

13. A semiconductor integrated circuit comprising:
a substrate including a semiconductor material;
an insulator film formed at least partially on said substrate;
a layer of wiring formed of a high $T_c$ superconductive material and disposed on at least one of said substrate and said insulator film, said layer of wiring adapted to be superconducting during operation of the semiconductor integrated circuit; and
a barrier layer made of a material which includes a nitride, for preventing diffusion of a metal ion of said superconductive material of said layer of wiring into said at least one of said substrate and said insulator film, upon which the layer of wiring is disposed, said barrier layer being disposed between said layer of wiring and said at least one of said substrate and said insulator film, whereby degradation of the integrated circuit, due to the metal ion of the superconductive material diffusing into said substrate, is avoided.

14. A semiconductor integrated circuit device as described in claim 13, wherein said barrier layer is formed of a material which does not reduce said superconductive material.

15. A semiconductor integrated circuit comprising:
a body including silicon;
a wiring layer formed of a high $T_c$ superconductive material, overlying said body, said wiring layer being adapted to be superconductive during operation of the semiconductor integrated circuit;
an intermediate member intervening between said body and said wiring layer, said including (1) a contact layer forming a low resistance contact with said body and (2) a barrier layer made of a material which includes a nitride, for preventing diffusion of a metal ion, which is a constituent element of said superconductive material, from the superconductive material of said wiring layer into said body, whereby degradation of the integrated circuit, due to the metal ion of the superconductive material diffusing into said body, is avoided.

16. A semiconductor integrated circuit as described in claim 15, wherein said barrier layer is formed of a material which does not reduce said oxide superconductive material.

17. A semiconductor integrated circuit as described in claim 1, wherein said isolation member prevents constituent elements of said superconductive material from diffusing into silicon-containing portions of said body, from said superconductive material.

18. A semiconductor integrated circuit as described in claim 17, wherein said silicon-containing portions of said body include silicon oxide films.

19. A semiconductor integrated circuit as described in claim 17, wherein said silicon-containing portions of said body include a silicon substrate.

20. A semiconductor integrated circuit as described in claim 19, wherein said circuit includes a plurality of semiconductor elements provided as part of said body, said semiconductor elements having active regions formed in said silicon substrate, and wherein said isolation member prevents said constituent elements from diffusing into said active regions.

21. A semiconductor integrated circuit as described in claim 3, wherein said compound is the nitride of the transition metal, and the transition metal is selected from the group consisting of Ti, Zr, Hf, V, Ni, Ta, Cr, W and Mo.

22. A semiconductor integrated circuit as described in claim 1, wherein the superconductive materials has perovskite crystal structure.

23. A semiconductor integrated circuit as described in claim 1, wherein the superconductive material has $K_2NiF_4$ crystal structure.

24. A semiconductor integrated circuit as described in claim 1, further comprising a shunt wiring provided in electrical contact with said superconductive material, whereby when a superconducting state of said superconductive material is lost an electrical current can by-pass through said shunt wiring.

25. A semiconductor integrated circuit as described in claim 24, wherein said shunt wiring is formed of Al.

26. A semiconductor integrated circuit as described in claim 24, wherein said shunt wiring is formed of TiN.

27. A semiconductor integrated circuit as described in claim 1, wherein the superconductive material is provided at at least two spaced-apart levels, in a direction extending away from the body, with an inter-layer insulating film between adjacent levels of the superconductive material, and wherein said isolation member is provided at least between said body and superconductive material at a lowermost level of superconductive material, closest to the body.

28. A semiconductor integrated circuit as described in claim 27, wherein said inter-layer insulating film is formed of silicon oxide, and wherein said isolation member is provided so as to substantially sandwich each level of the superconductive material.

29. A semiconductor integrated circuit as described in claim 28, wherein the isolation member is formed of TiN.

30. A semiconductor integrated circuit comprising:
a body, containing semiconductor material;
a film of a high-$T_c$ superconductive material positioned so as to overlie said body, said film being adapted to be superconducting during operation of the semiconductor integrated circuit; and
an isolation member, of a material, which includes a nitride, preventing diffusion of constituent elements of the superconductive material into the body, positioned so as to prevent the constituent elements of said superconductive material from diffusing into said body, whereby degradation of the integrated circuit, due to constituent elements of the superconductive material diffusing into said body, is avoided.

31. A semiconductor integrated circuit as described in claim 30, wherein said semiconductor material is a material selected from the group consisting of GaAs, InSb, and InP.

32. A semiconductor integrated circuit as described in claim 30, wherein said isolation member prevents constituent elements of said superconductive material from diffusing into semiconductor material-containing portions of said body.

33. A semiconductor integrated circuit as described in claim 30, wherein said nitride is selected from the group consisting of silicon nitride and a nitride of a transition metal.

34. Structure for preventing diffusion of constituent elements of superconductive material into a body of semiconductor material, comprising:
a body of semiconductor material;
a film of a high $T_c$ superconductive material overlying said body, such that said film will be superconducting when said film is at a temperature less than the critical temperature of the high $T_c$ superconductive material; and
an isolation member, of a material, which includes a nitride, preventing diffusion of the constituent elements of the superconductive material.

35. Structure as described in claim 34, wherein said semiconductor material includes active regions of semiconductor elements of a semiconductor device, the isolation member preventing degradation of the semiconductor elements due to the constituent elements of the high $T_c$ superconductive material diffusing into the body.

36. Structure as described in claim 34, wherein said structure forms part of a semiconductor integrated circuit device.

37. Structure for preventing diffusion of constituent elements of superconductive material external of the superconductive material, comprising:
a member of a first material selected from the group consisting of a semiconductor material and an insulator;
a film of a high $T_c$ superconductive material said film being superconducting at a temperature less than the critical temperature of the high $T_c$ superconductive material; and
an isolation member, of a second material, which includes a nitride, preventing said diffusion of the constituent elements.

38. Structure as described in claim 37, wherein said first material is selected from the group consisting of silicon and silicon oxide.

39. A structure as described in claim 38, wherein said high $T_c$ superconductive material is a high $T_c$ oxide superconductive material.

40. Structure as described in claim 38, wherein said constituent elements are at least one selected from the group consisting of Pb, Cu, Ba, La, Sr, K and Y.

41. Structure as described in claim 37, wherein said isolation member is interposed between the member and the film of a high $T_c$ superconductive material.

42. Structure as described in claim 37, wherein said isolation member is a coating on said film of high $T_c$ superconductive material.

43. Structure as described in claim 37, wherein said nitride in a nitride of a transition metal.

44. Structure as described in claim 37, wherein said nitride is a nitride of a metal selected from the group consisting of Ti, Zr, Hf, V, Ni, Ta, Cr, W and Mo.

* * * * *